US007735216B2

(12) United States Patent
Schnabel et al.

(10) Patent No.: US 7,735,216 B2
(45) Date of Patent: Jun. 15, 2010

(54) MICRO-ELECTROMECHANICAL SUB-ASSEMBLY HAVING AN ON-CHIP TRANSFER MECHANISM

(75) Inventors: Christopher M. Schnabel, Poughkeepsie, NY (US); Peter A. Smith, Wappingers Falls, NY (US); John E. Florkey, Centerville, OH (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 785 days.

(21) Appl. No.: 10/597,012

(22) PCT Filed: Jan. 15, 2004

(86) PCT No.: PCT/US2004/000987

§ 371 (c)(1),
(2), (4) Date: Jul. 6, 2006

(87) PCT Pub. No.: WO2005/079128

PCT Pub. Date: Aug. 25, 2005

(65) Prior Publication Data

US 2009/0019691 A1  Jan. 22, 2009

(51) Int. Cl.
*B23P 19/00* (2006.01)
*H05K 3/30* (2006.01)
(52) U.S. Cl. .............................. 29/740; 29/741; 29/742; 29/832; 29/834
(58) Field of Classification Search .................... 29/739, 29/740, 729, 742, 741, 828, 832–834; 414/224.01, 414/225.01, 226, 752.1, 744.3; 294/95, 116; 198/468.2; 257/700 MS, 754
See application file for complete search history.

(56) References Cited

U.S. PATENT DOCUMENTS

| 3,724,068 A | | 4/1973 | Galli |
| 4,342,090 A | | 7/1982 | Caccoma et al. |
| 4,908,092 A | | 3/1990 | Koibuchi |
| 5,307,978 A | * | 5/1994 | Ricketson et al. ............ 228/4.5 |
| 5,596,229 A | * | 1/1997 | Simon ........................ 257/727 |
| 5,769,236 A | * | 6/1998 | Maruyama et al. .......... 206/714 |
| 5,822,847 A | | 10/1998 | Arakawa et al. |

(Continued)

FOREIGN PATENT DOCUMENTS

JP    09-117164    5/1997

(Continued)

*Primary Examiner*—Minh Trinh
(74) *Attorney, Agent, or Firm*—H. Daniel Schnurmann

(57) ABSTRACT

Carriers (10) holding parts (50) for assembling complex MEMS devices are transported to a central assembly location. The parts are stacked in a pre-assigned order and later released from their carriers. Alternatively, they are positioned over the appropriate location and released so as to fall into position as needed. The assembly area (100) includes a cavity below the plane of the carriers such that the parts held within the carrier drop into the cavity. Heating elements are integrated into the cavity to assist in the release of the parts. The cavity is supplied with parts by one or more carriers which are move around by any number of MEMS drive systems (200, 250). The cavity and some of the MEMS assembled therein deliver with precision amounts of materials as required suitable for biomedical applications, or may be processed in-situ, as in an on-chip laboratory.

17 Claims, 18 Drawing Sheets

U.S. PATENT DOCUMENTS

| | | |
|---|---|---|
| 5,955,801 A | 9/1999 | Romero et al. |
| 5,994,159 A | 11/1999 | Aksyuk et al. |
| 6,740,920 B2 | 5/2004 | Chidambarrao et al. |
| 6,887,615 B1 * | 5/2005 | Sherman et al. ............... 429/61 |
| 6,960,849 B1 * | 11/2005 | Klody et al. .......... 310/40 MM |
| 7,240,422 B2 * | 7/2007 | Cheung et al. ................. 29/762 |
| 7,491,567 B2 * | 2/2009 | DCamp et al. ................. 438/51 |
| 7,505,373 B2 * | 3/2009 | Paratte et al. ............... 368/157 |
| 2002/0026724 A1 | 3/2002 | Moon et al. |
| 2003/0088966 A1 | 5/2003 | Ehrfeld et al. |
| 2004/0029481 A1 | 2/2004 | Gross et al. |
| 2009/0019691 A1 * | 1/2009 | Schnabel et al. .............. 29/834 |

FOREIGN PATENT DOCUMENTS

| | | |
|---|---|---|
| JP | 11-12929 | 1/1999 |
| JP | 11-004832 | 12/1999 |
| JP | 2002-018798 | 1/2002 |
| WO | WO98/39230 | 9/1998 |

* cited by examiner

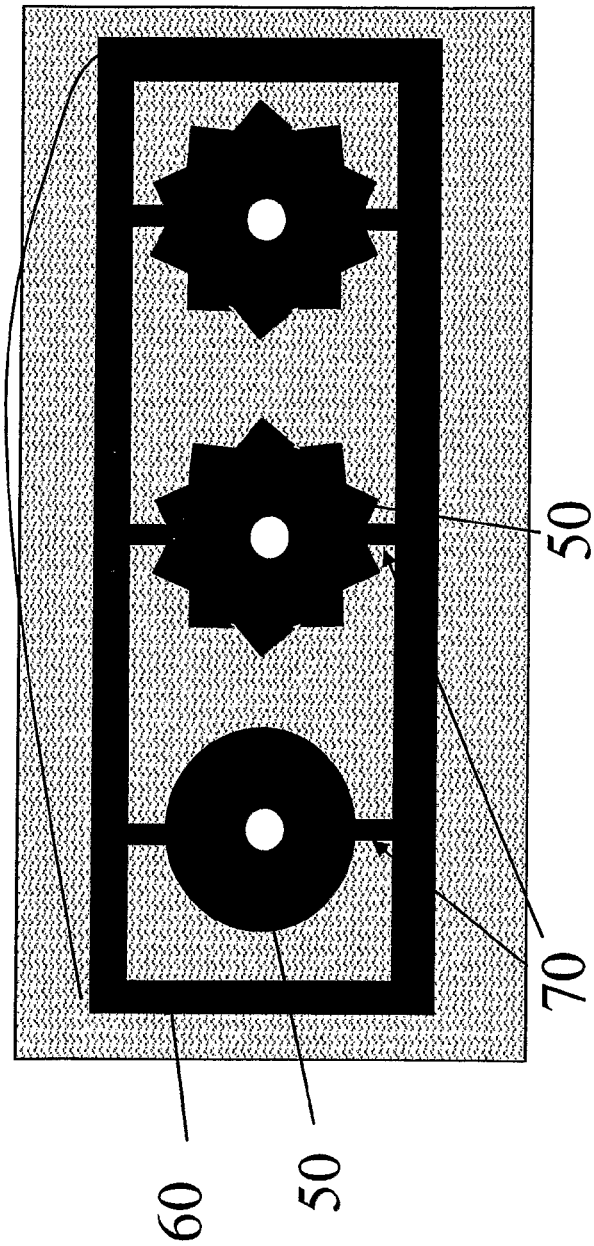
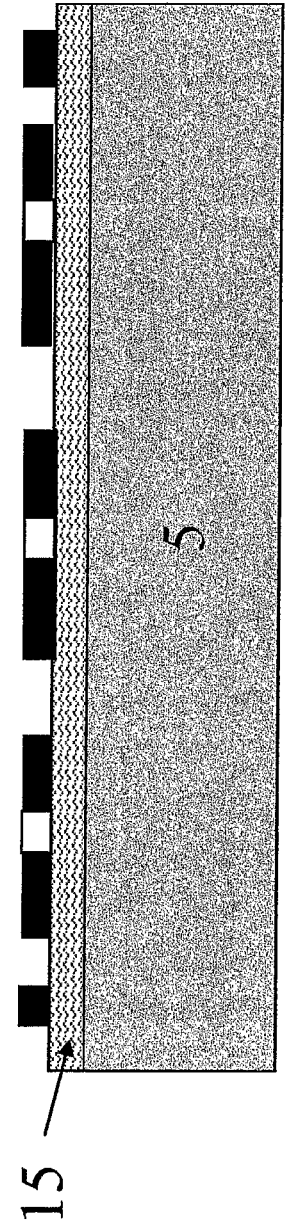
Fig. 3
Fig. 4

MICRO-ELECTROMECHANICAL SUB-ASSEMBLY HAVING AN ON-CHIP TRANSFER MECHANISM

BACKGROUND OF THE INVENTION

This invention generally relates to micro-electromechanical system (MEMS) devices, and more particularly, to the fabrication of self-assembling MEMS to facilitate their manufacture using current state of the art semiconductor fabrication processes.

Products using MEMS technology are widespread in the biomedical, aerospace, automotive and communications industries. Conventional MEMS require complex multilevel processing in order to produce even the simplest machines. Most entities that are interested in exploring the MEMS market have limited options for prototyping devices and little or no expertise. Often, the processes and materials required are not compatible with their current process flows.

Conventional MEMS typically utilize cantilever switches, membrane switches, and tunable capacitor structures. MEMS devices are manufactured using micro-electromechanical techniques and are used to control electrical, mechanical or optical signal flows. Such devices, however, present many problems because their structure and innate material properties require them to be manufactured in lines that are separate from conventional semiconductor processing. This is usually due to different materials and processes which are not compatible and, therefore, which cannot be integrated in standard semiconductor fabrication processes.

U.S. Pat. No. 5,994,159 to Aksyuk et al. describes a plurality of hinged plates attached to a support which upon actuation assemble into a final structure. Such a method is limited in its ability to build complex MEMS structures, since the movable parts are hinged and will not move, inherently requiring that the parts of the assembly be fabricated in-situ albeit in a different orientation. As MEMS become more complex with larger part counts, such a technique is no longer feasible.

In view of the foregoing drawbacks presently encountered in the industry, there is a need for a process that is capable of providing MEMS devices using established BEOL (Backend of the line) materials coupled to processing that is fully integrated in order that these devices be manufactured either in conjunction with or as an add-on module to the conventional BEOL or interconnect levels.

OBJECTS AND SUMMARY OF THE INVENTION

Accordingly, it is an object of this invention to construct MEMS devices requiring multiple layers or laminations of parts and/or sub-assemblies from simpler structures which are fabricated and assembled on a single substrate.

It is another object to provide drive or assembly mechanisms on the same substrate and assemble the various parts into one or more multilevel system.

It is a further object to place such assemblies into or onto another assembly after constructing in order to fabricate more complex systems.

It is still another object to transfer assemblies or sub-assemblies from one substrate to another to construct more complex MEMS than would not have been possible otherwise.

It is yet another object to manufacture MEMS structures using a modified damascene process.

These and other objects are addressed by the present invention by providing a method of fabricating multi-level MEMS devices by constructing many parts in a single layer and then assembling them in order to form multilayer or laminated devices.

Carriers containing the parts to be assembled into complex MEMS devices are transported to a common assembly location. The parts are then stacked in a pre-assigned order and later released from their carriers. Alternatively, they are positioned over the appropriate location and released so as to fall into position as needed.

The assembly area includes a cavity below the plane of the carriers such that the pieces defined within the carrier drop into the cavity. Heating elements are integrated into the cavity to assist in the release of the parts. The cavity is supplied with appropriate parts by carriers positioned by any number of MEMS drive systems. The cavity and some of the MEMS assembled therein deliver with precision amounts of materials as required, e.g., in biomedical applications, or are processed in-situ, as in an on-chip laboratory.

The carriers hold and move the parts being assembled, each carrier containing one or a plurality of parts. The carriers and their corresponding parts are made of any number of materials depending upon their final applications. Some materials which are common to semiconductor manufacturing lines such as, SiN, $SiO_2$, Si, polysilicon, Al, Cu, SiGe, Ti, Ti—Ni, BPSG and polymers like polyimides, are used for such devices.

Once the carrier or carriers deliver their parts for assembly, the parts are released by a dry etch which severs the smallest connections by ion milling, by heating, by either melting or volatizing some portions thereof or by incorporating circuits in the carrier and parts thereof, so that the links can be programmed (i.e., blown) like fuses. Thus releasing by directed laser is also possible.

The assembled MEMS devices are then used in-situ or transferred to another substrate as a stand-alone device or as a sub-assembly added to others of a similar type to form a more complex system. Applications for such devices include, but are not limited to, medical, biotech, detection systems for chemical and biological agents, wireless, automotive, and aerospace.

BRIEF DESCRIPTION OF THE DRAWINGS

The accompanying drawings, which are incorporated in and which constitute a part of the specification, illustrate presently preferred embodiments of the invention and together with the general description given above and the detailed description of the preferred embodiments given hereinafter serve to explain the principles of the invention.

FIGS. 3 and 4 are, respectively, a planar and a cross-section of a carrier carrying parts to be assembled.

DETAILED DESCRIPTION OF THE INVENTION

Figure 1:
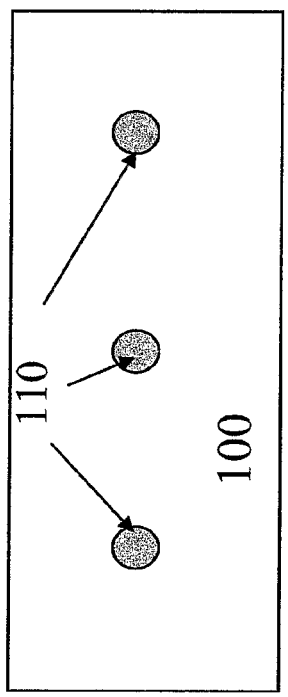
FIGS. 1 and 2 are, respectively, a planar and a cross-section view of the assembly area, in accordance with the present invention.

FIG. 1 illustrates a planar view of the assembly area as a cavity 100 with structures 110 acting as axels or posts in substrate 5. These posts may take the form of alignment posts attached to the cavity. Other means for alignment may be provided by the sidewalls of the cavity in lieu of the posts. In the preferred embodiment, the cavity 100 subsequently receives the parts onto the posts for assembly. The parts are provided with holes corresponding to the posts. As the parts are introduced in the cavity, holes in the parts matching the posts in the cavity allow the parts to be fall or to be lowered into the cavity in a predetermined position. The sidewalls of the cavity or the vertical faces of the posts may be sloped. Such a slope is advantageously implemented using standard etching. When a cavity is used in the assembly, the top of the opening is to be larger than the bottom. In the case of a post being utilized, the top of the post is to be smaller than the bottom. In both cases, the sloping faces improve the ability to align parts within the cavity, and as the parts lower into the cavity the sloping sidewalls guide the part to its proper location.

Figure 2:
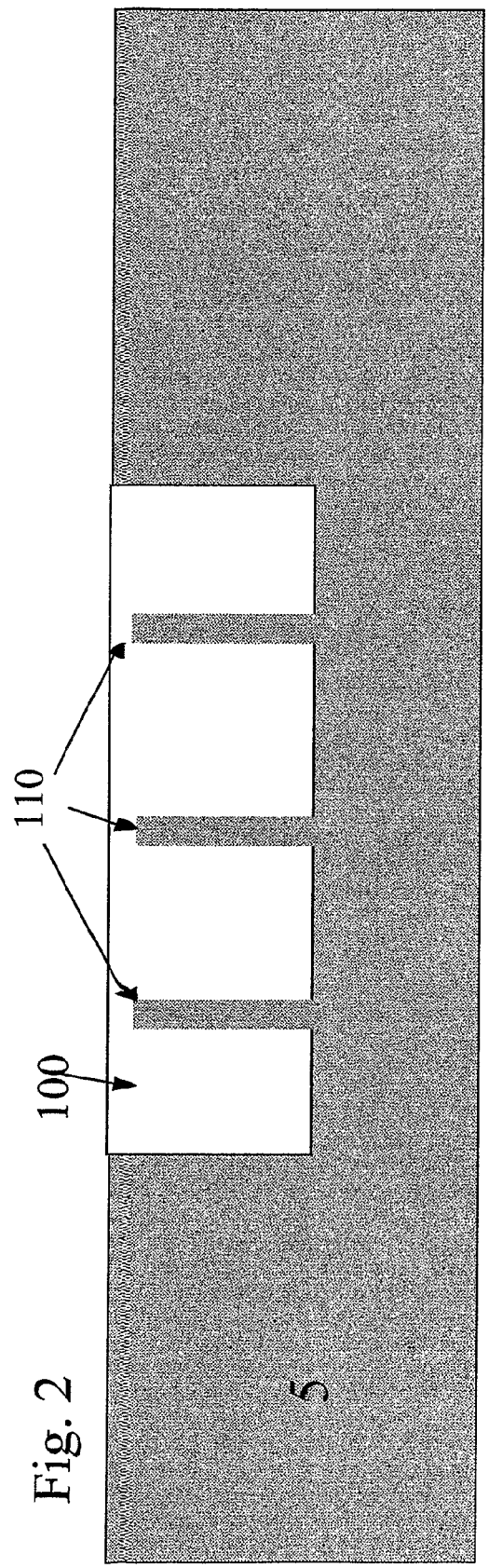

FIG. 2 is a cross-section view of FIG. 1 further illustrating the assembly area as cavity 100 with the axel structures 110. In this case, vertical sidewalls are shown.

FIG. 3 shows a planar view of the carrier assembly 10 with attached parts 50. Also shown is a frame 60 serving to hold the parts 50 by means of sacrificial tabs 70. The parts 50 may include any number of structures or devices that are to be assembled and which must be transported by the carrier to the assembly area. The transport and assembly will be described in further detail hereinafter.

Once the carrier is in place for assembly, tabs 70 are disconnected using any method described next in order to release the parts 50. In the present example, they are advantageously allowed to rotate on an appropriate axle in order to facilitate their interaction with other parts that make up the overall assembled device.

The tabs 70 may be removed in several ways. One option is to perform an isotropic etch that removes all the tabs. Properly designed tabs typically have a large aspect ratio, allowing such an etch to be performed without inflicting a negative effect on the remaining parts. An alternate method is to remove the tabs using a material that opens the fuse when current is passed through it. Although this requires the use of conductive materials, the current may be supplied by on-chip circuitry or by an off-chip source contacting the chip, using probes and the like. A third option for tab removal is by way of laser ablation.

A fourth option is to dispense using tabs altogether. Prior to removing the sacrificial layer 15, the gap between the carrier and the parts is filled with material that is selectively etched with respect to the carrier and parts. This material provides mechanical support to hold the parts in-situ with respect to the carrier, and may be easily etched once the carrier is in place for assembly.

FIG. 4 illustrates a cross-section view of FIG. 3. Therein is illustrated the use of a sacrificial layer 15 upon (or within) which the carrier and its parts are formed and later released for transport and assembly. The sacrificial layer may be removed by etching. Once the sacrificial layer is removed, the carrier and parts are free to be transported to a different location, namely, the assembly area.

Figure 5:
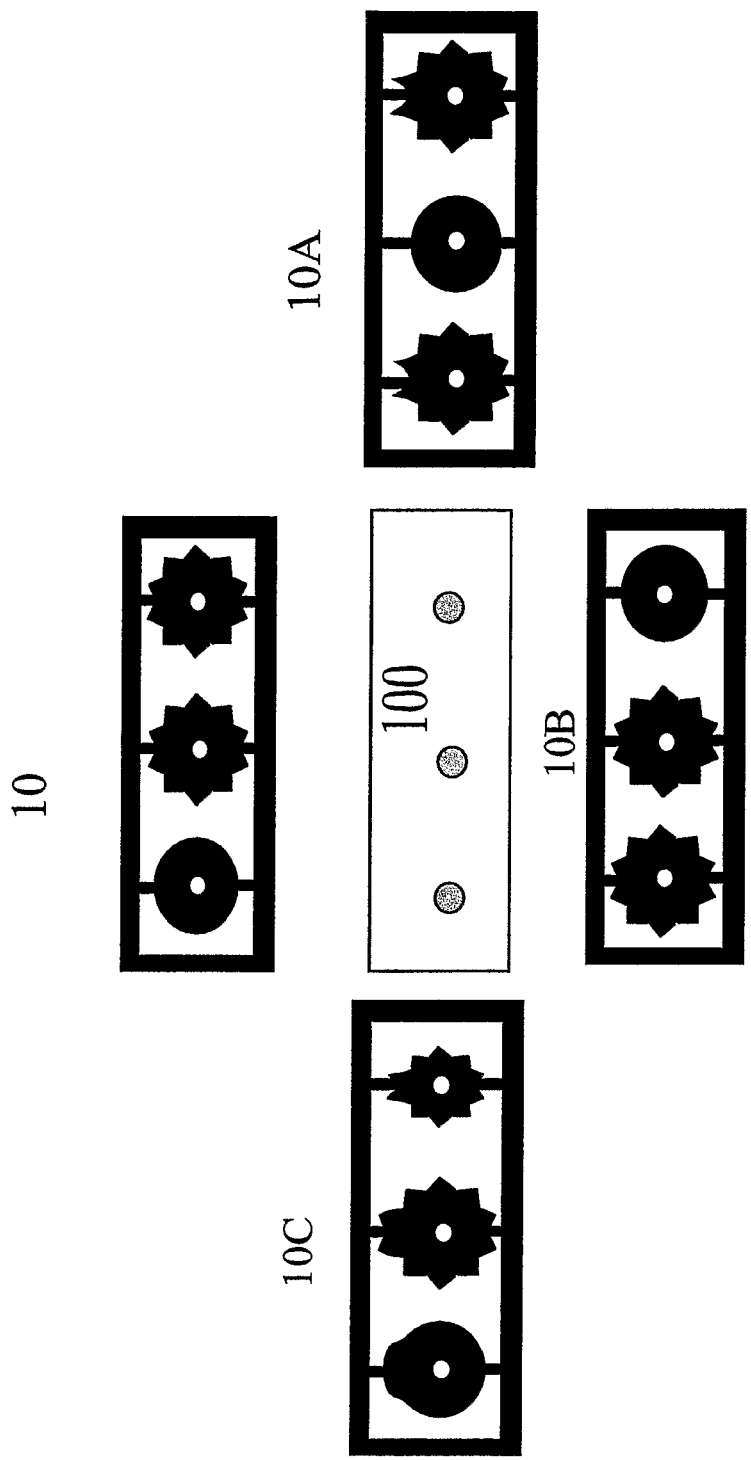
FIG. 5 shows a first embodiment of carriers including parts positioned around the assembly area.

FIG. 5 shows a planar view of the assembly area 100 with multiple carriers 10, 10A, 10B and 10C surrounding the assembly area. This illustrates only one of many possible configurations for readying the parts for assembly. Each carrier is, in turn, positioned over or into the assembly area by any number of currently known MEMS technology drive systems. The parts are then released to form the assembled device.

Figure 6A:
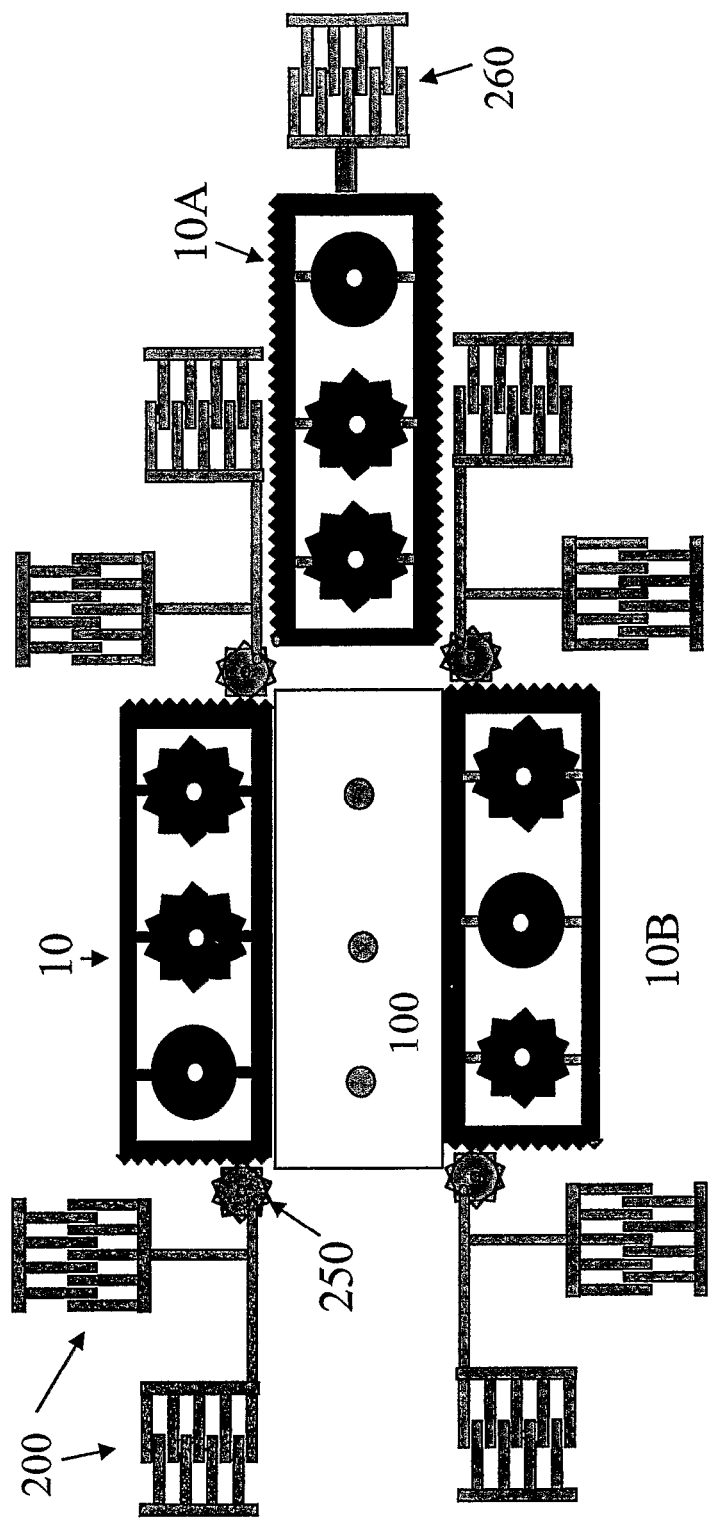
FIG. 6A illustrates an arrangement of carriers loaded with parts, including the drive systems and assembly sequence.

FIG. 6A illustrates a planar view similar to FIG. 5 with various carriers 10, 10A and 10B surrounding the assembly area 100. It also illustrates some possible mechanisms by which the carriers move into position for assembly. In the present example, electrostatic comb drives 200 are used to turn gears 250 which engage matching teeth on the carrier frame, thereby, moving them in position. This is further illustrated in the next figures.

The drives may be actuated using circuitry and logic internal to the chip that sequentially moves the parts and carriers into position in a predetermined manner (not shown). An alternative is the activation of the drives from an external source.

Figure 6B:
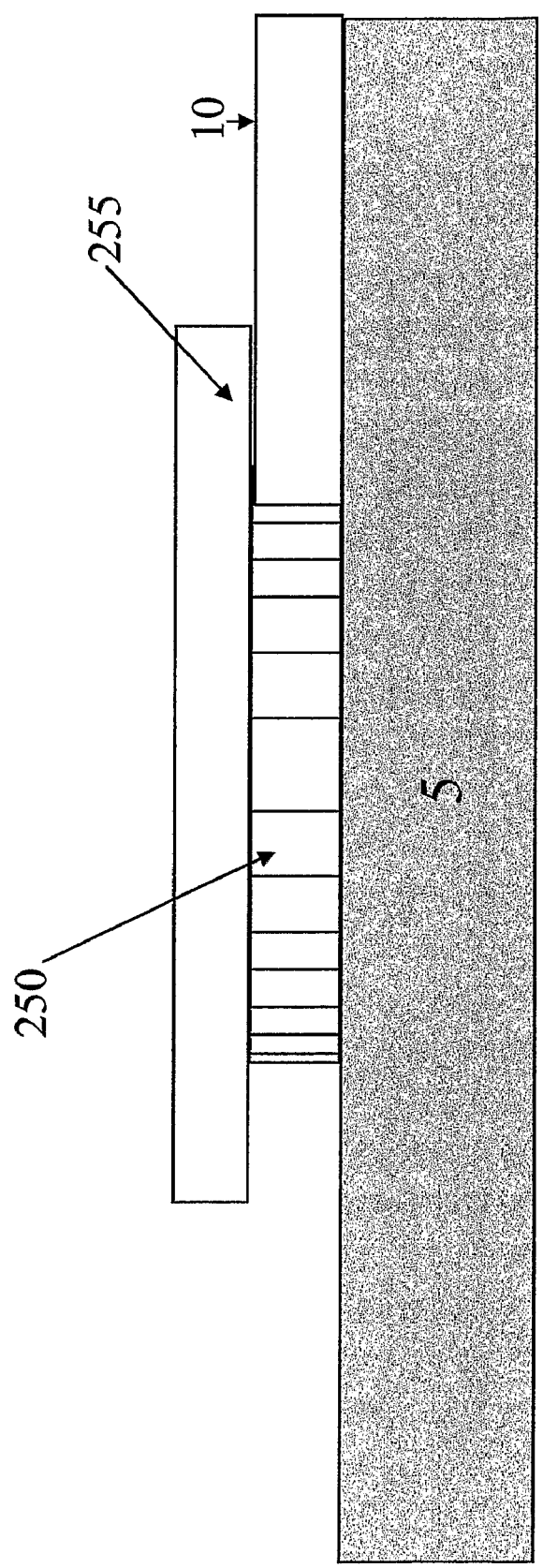
FIG. 6B is a side view of the arrangement shown in FIG. 6A depicting the gears having a shoulder.

FIG. 6B is a side view of the arrangement shown in FIG. 6A depicting the gears having a shoulder.

Figure 7:
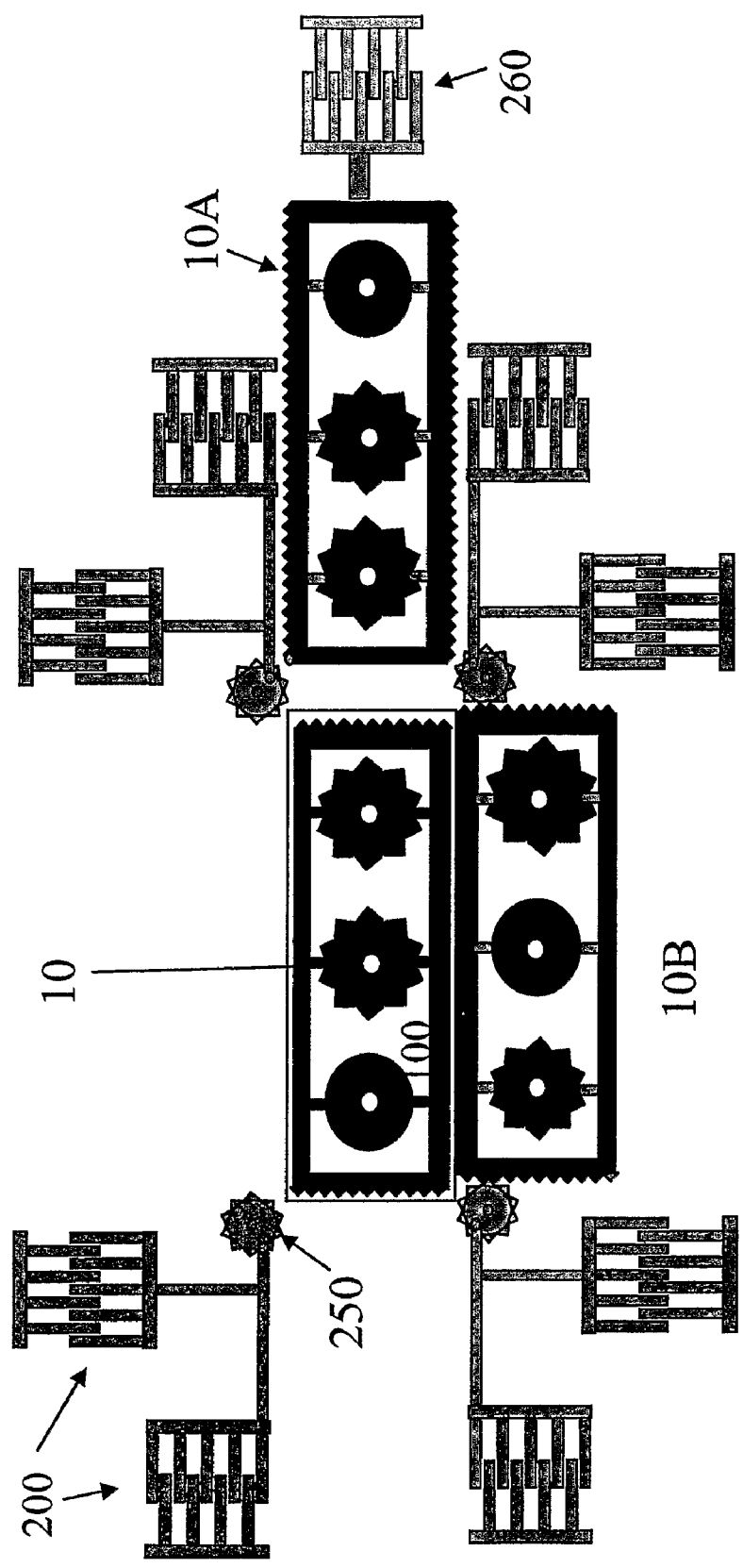
FIGS. 7, 7A and 7B illustrate several embodiments for the arrangement of carriers loaded with parts, including the drive systems and assembly sequence.

FIG. 7 shows the arrangement illustrated in FIG. 6A, after moving carrier 10 to the assembly area by way of the two upper drives. Moving the carrier over the cavity may be done in a variety of ways. One option is having gears 250 provided with shoulder 255, as shown in FIG. 6B. Shoulder 255 supports carrier 10 in a cantilever fashion when the carrier is partially positioned over the cavity, keeping the carrier from falling into the cavity in an unintended manner. Once the carrier sufficiently covers the cavity, it is supported by posts until these posts align with the holes within the parts, at which time the carrier will fall as intended into the cavity.

Figure 7A:
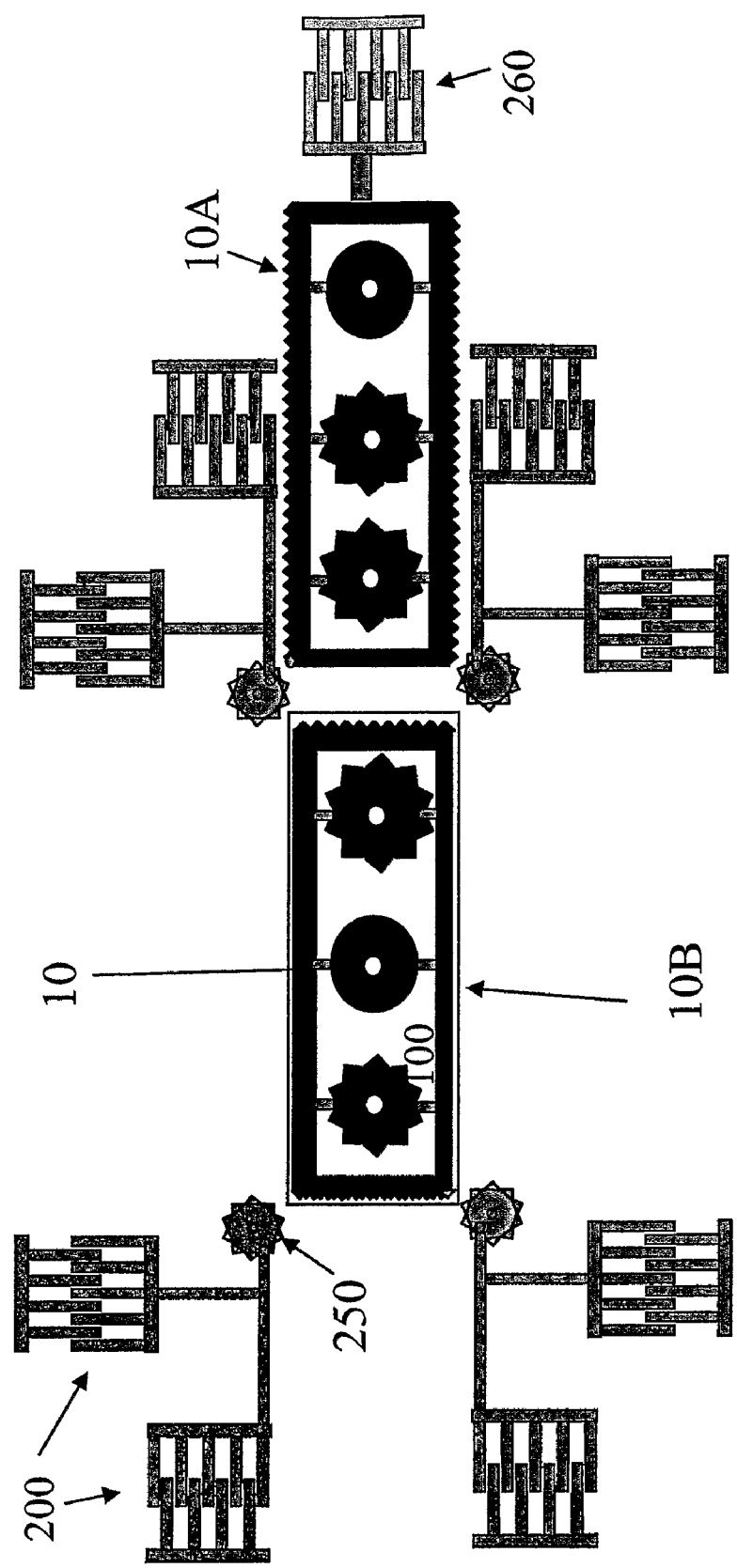

FIG. 7A shows the arrangement as in FIG. 7, after carrier 10B is placed on top of carrier 10 in the assembly area 100 by way of the lower drive systems.

Figure 7B:
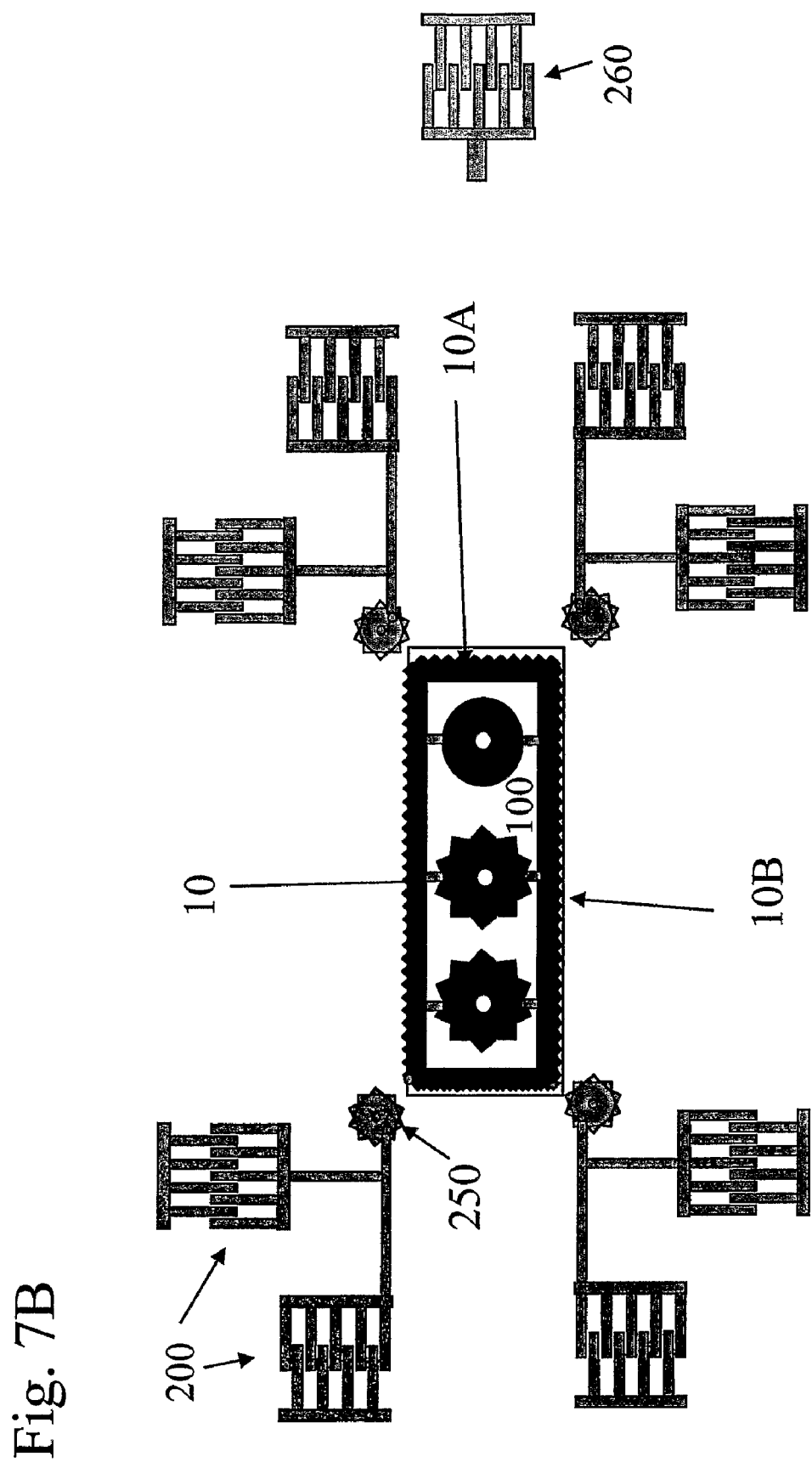

FIG. 7B shows the arrangement of FIG. 7A after the carrier 10A has been placed on top of the other carries in the assembly area. In this case, the comb drive 260 forces the carrier to engage the two right hand gear systems to complete moving the carrier into the assembly area.

Figure 8:
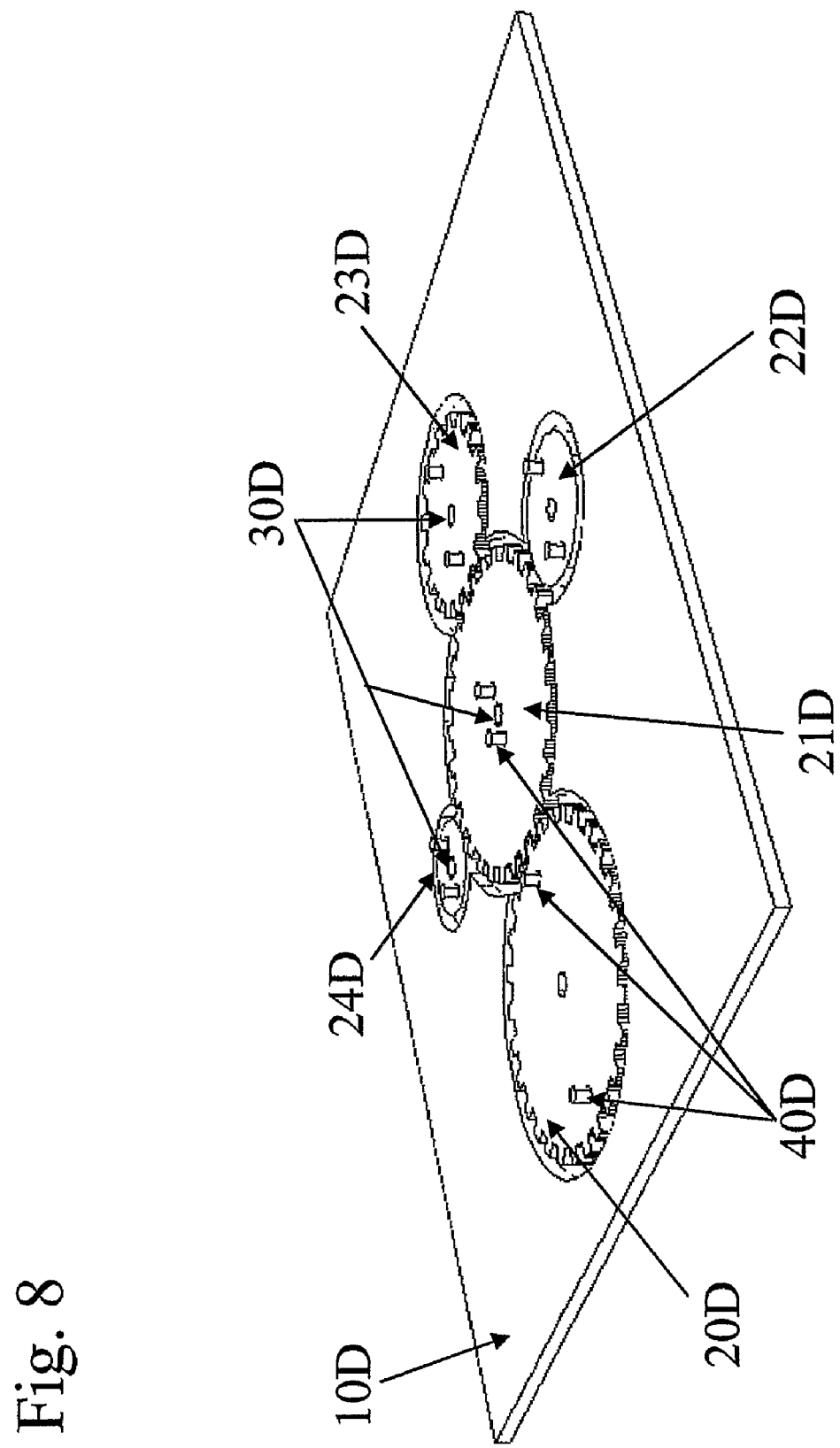
FIG. 8 shows a perspective view of the carrier with gears and spacers.

FIG. 8 shows parts 20D, 21D, 22D, 23D and 24D within carrier 10D, and constructed by way of semiconductor processing techniques described hereinafter. The parts are advantageously provided with holes 30D at their center points around which they rotate. The pins 40D shown are also fabricated using semiconductor processing, although they may be manufactured in their own carrier. The pins 40D serve many purposes, among which are transfer of power between vertically stacked parts (not shown), stabilizing the parts, and as an aide to alignment for stacked carriers (not shown).

Figure 9:
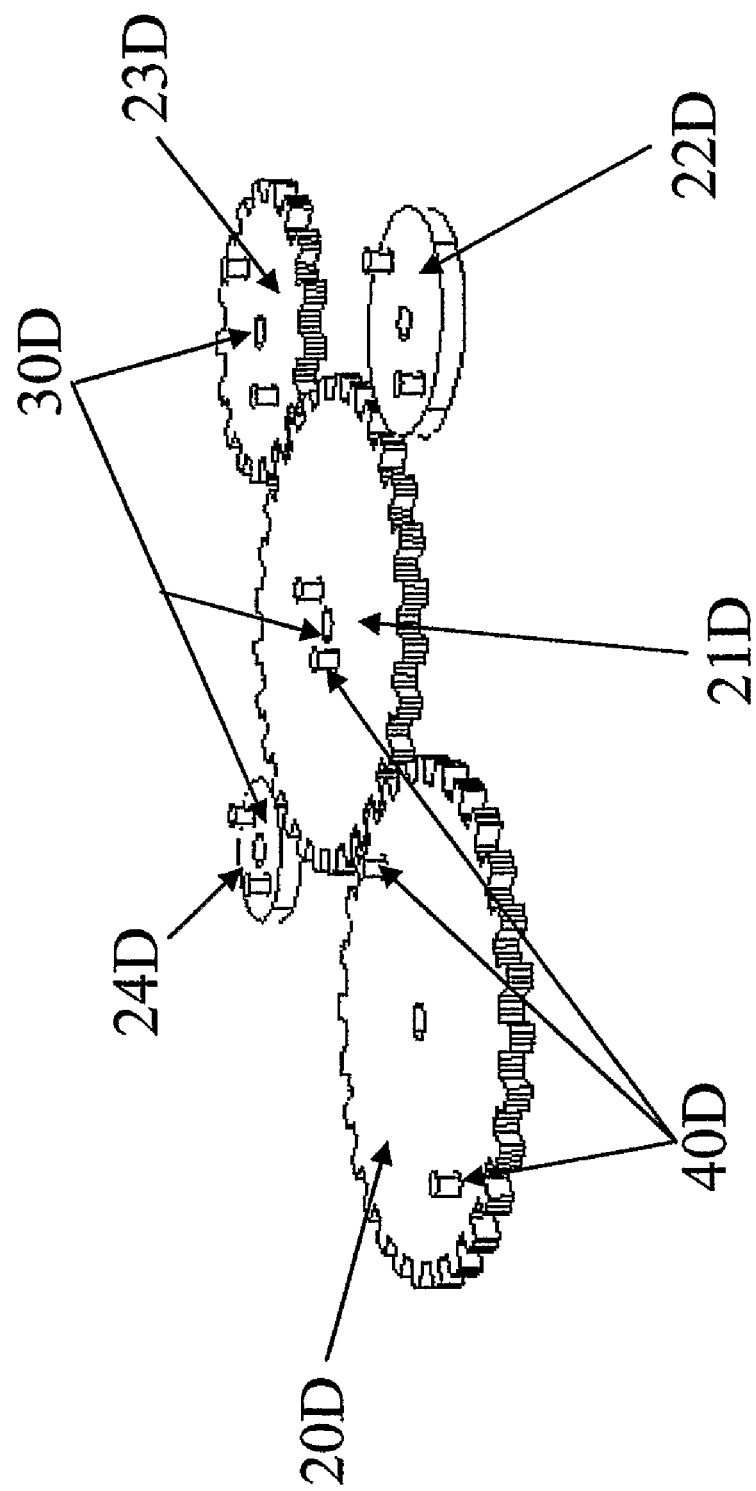
FIG. 9 illustrates the same parts shown in FIG. 8 after being released from the carrier.

FIG. 9 shows the parts depicted in FIG. 8 after being released from the carrier. Parts may be freed from the carrier prior to assembly, after assembly, or not at all.

Figure 10:
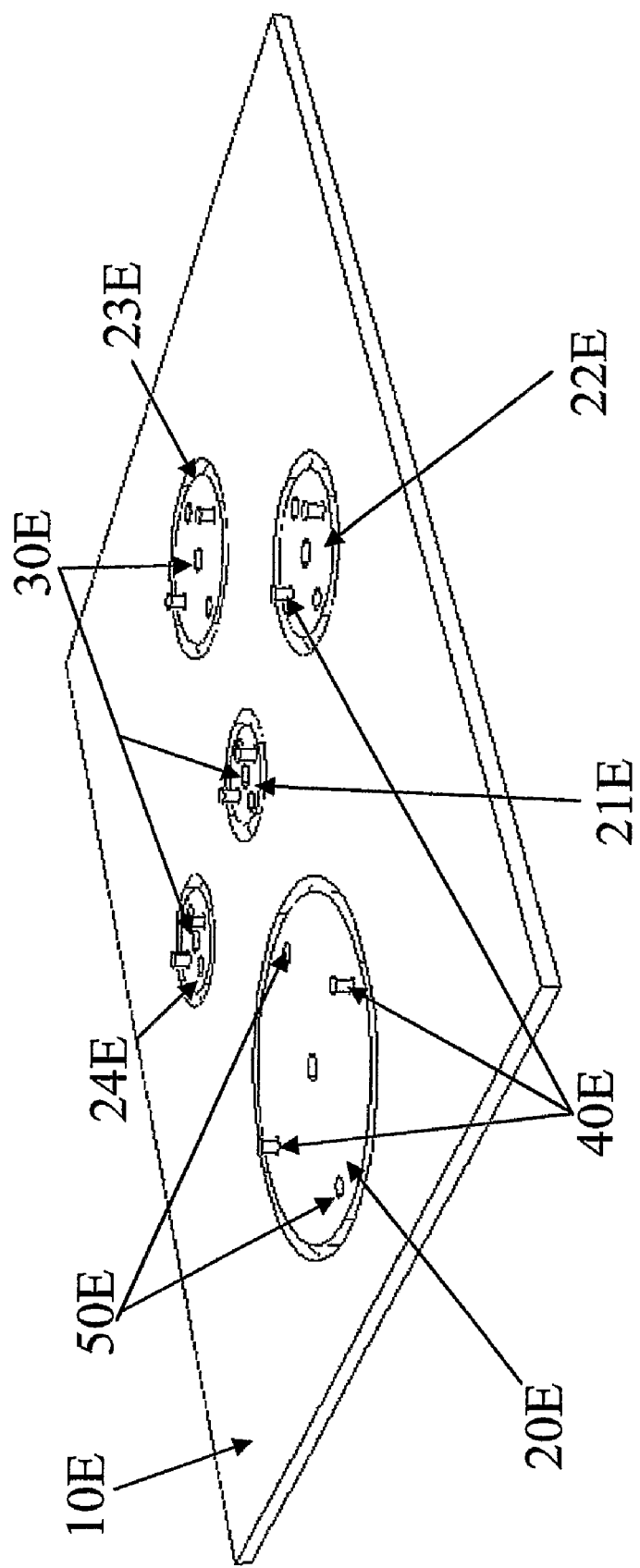
FIGS. 10 and 11 illustrate the addition of vertical alignment, connection pins and sockets for assembly and transfer of motion vertically through the assembled parts.

FIG. 10 shows parts 20E, 21E, 22E, 23E and 24E within carrier 10E are fabricated by way of semiconductor processing techniques described hereinafter. The parts may have holes 30E at their center points around which they may rotate once released from the carrier. The pins 40E are also defined using semiconductor processing, although they may be fabricated in their own carrier. The pins 40E serve many purposes, among which are transferring power between vertically stacked parts (not shown), stabilization of parts, and as an aide to alignment for stacked carriers (not shown). The holes shown on the parts 50E mate with the pins 40D of the parts defined within carrier 10D depicted in FIG. 8.

Figure 11:
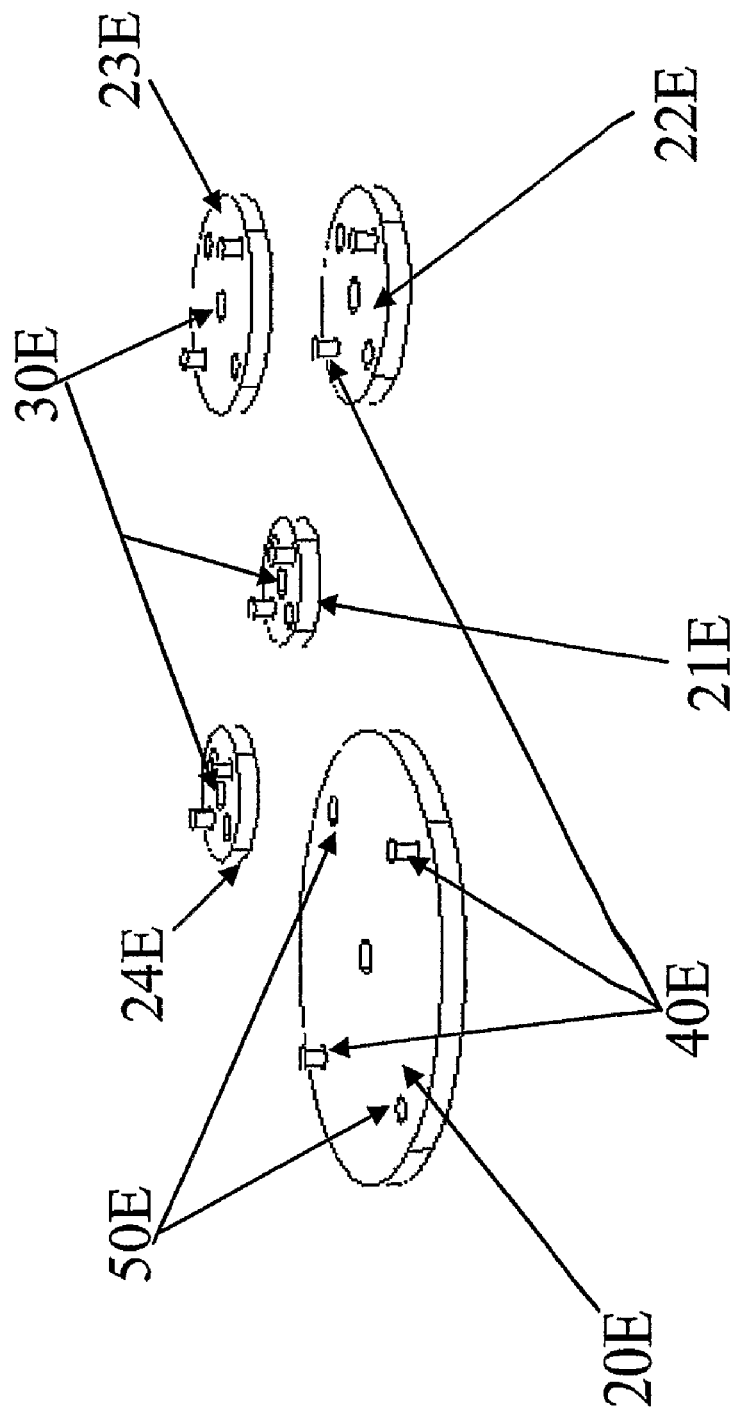

FIG. 11 shows the parts as in FIG. 10 released from the carrier. Parts may be released from the carrier prior to assembly, after assembly, or not at all.

Figure 12:
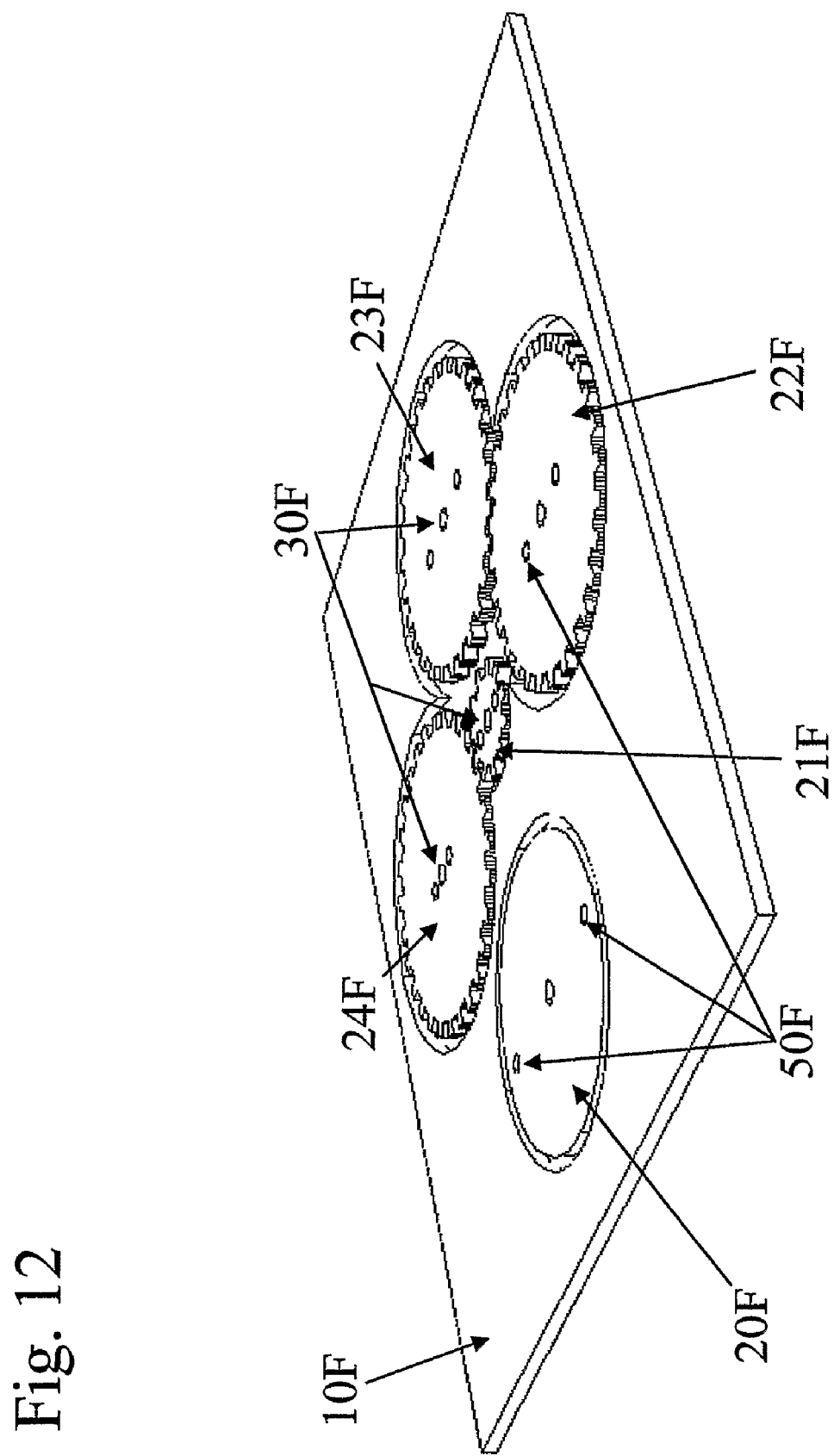
FIG. 12 shows a second embodiment of the carrier loaded with parts.

FIG. 12 shows parts 20F, 21F, 22F, 23F and 24F within carrier 10F are fabricated by way of semiconductor processing techniques described hereinafter. The parts may have holes 30F at their center points around which they may rotate once released from the carrier. The holes shown on the parts 50F mate with the pins 40E of the parts defined within carrier 10E depicted in FIG. 8.

Figure 13:
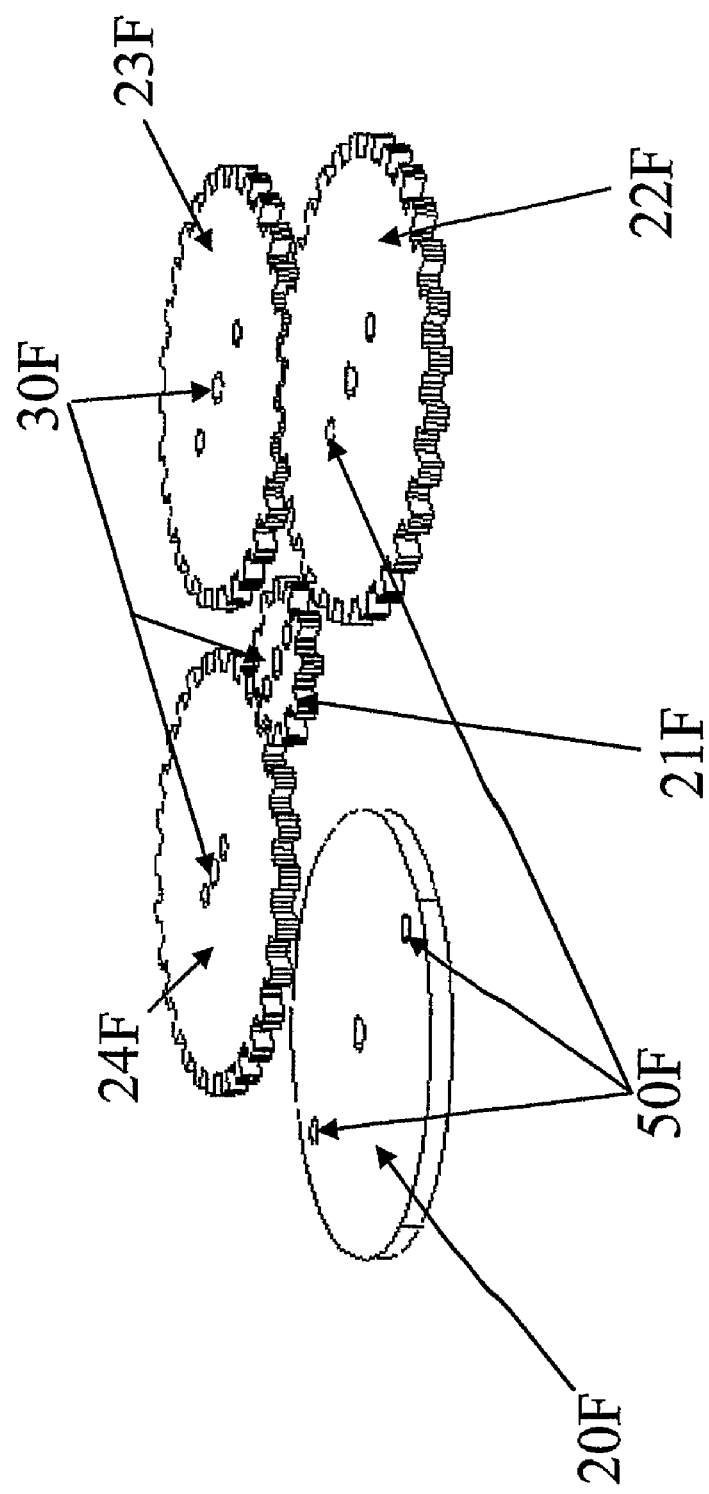
FIG. 13 shows the parts from FIG. 12 after being released from the carrier.

FIG. 13 shows the parts as in FIG. 12 released from the carrier. Parts may be released from the carrier prior to assembly, after assembly, or not at all.

Figure 14:
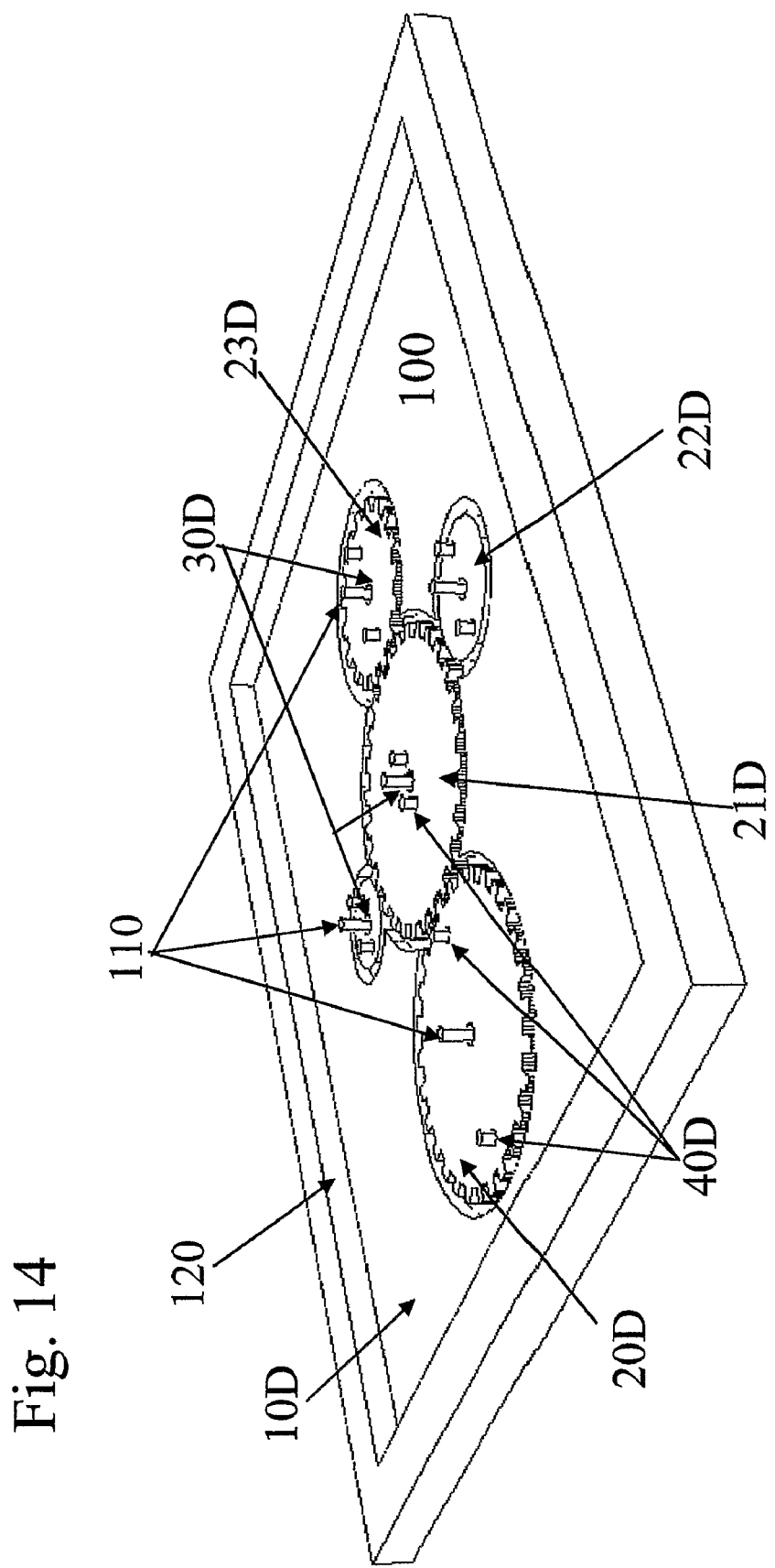
FIG. 14 shows the carrier loaded with parts aligned with the assembly area.

FIG. 14 shows carrier 10D aligned within cavity 100. Alignment may occur through internal means such as the pins 110 within the cavity mated with the holes 30D in the parts themselves. Although not depicted, pins 110 may also be aligned through holes in the carrier itself. Alignment may occur through external means by aligning carrier 10D with cavity sidewalls 120.

Figure 15:
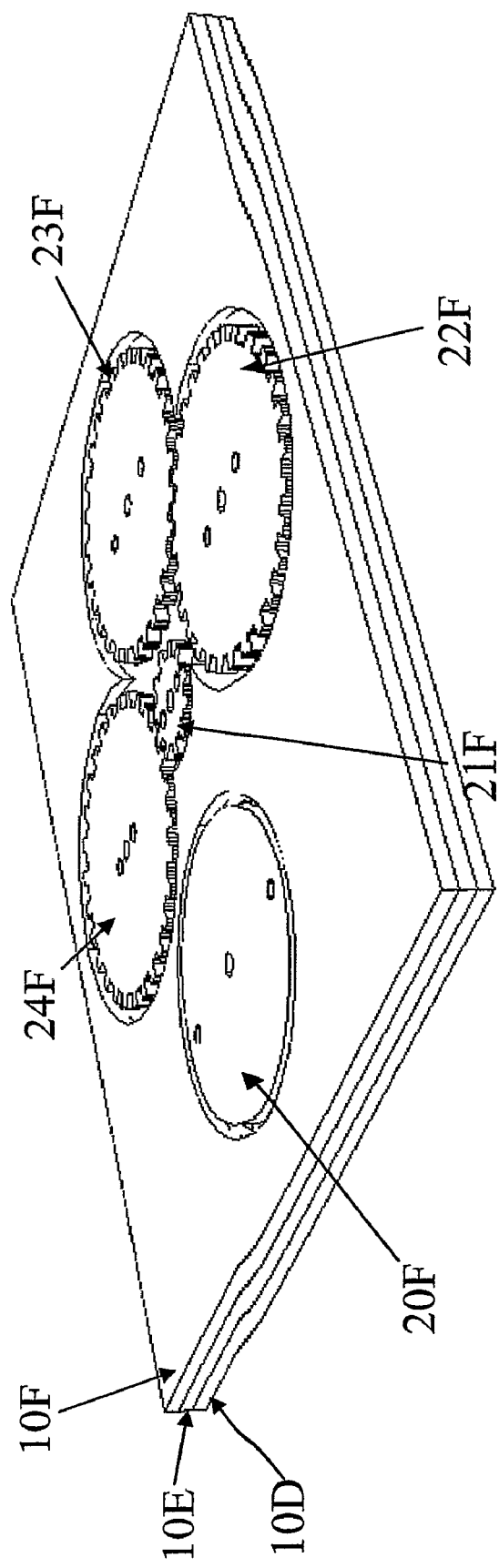
FIG. 15 shows a plurality of stacked carriers as they appear during an assembly phase.

FIG. 15 shows carriers 10D, 10E and 10F after stacking. The carriers 10D, 10E, 10F may be removed leaving the parts shown in FIGS. 9, 11 and 13 remain in place. Although, cavity 100 is not depicted, the assembly may remain in the cavity 100 or it may be removed from the cavity 100, as a final assembly or a sub-assembly.

Figure 16:
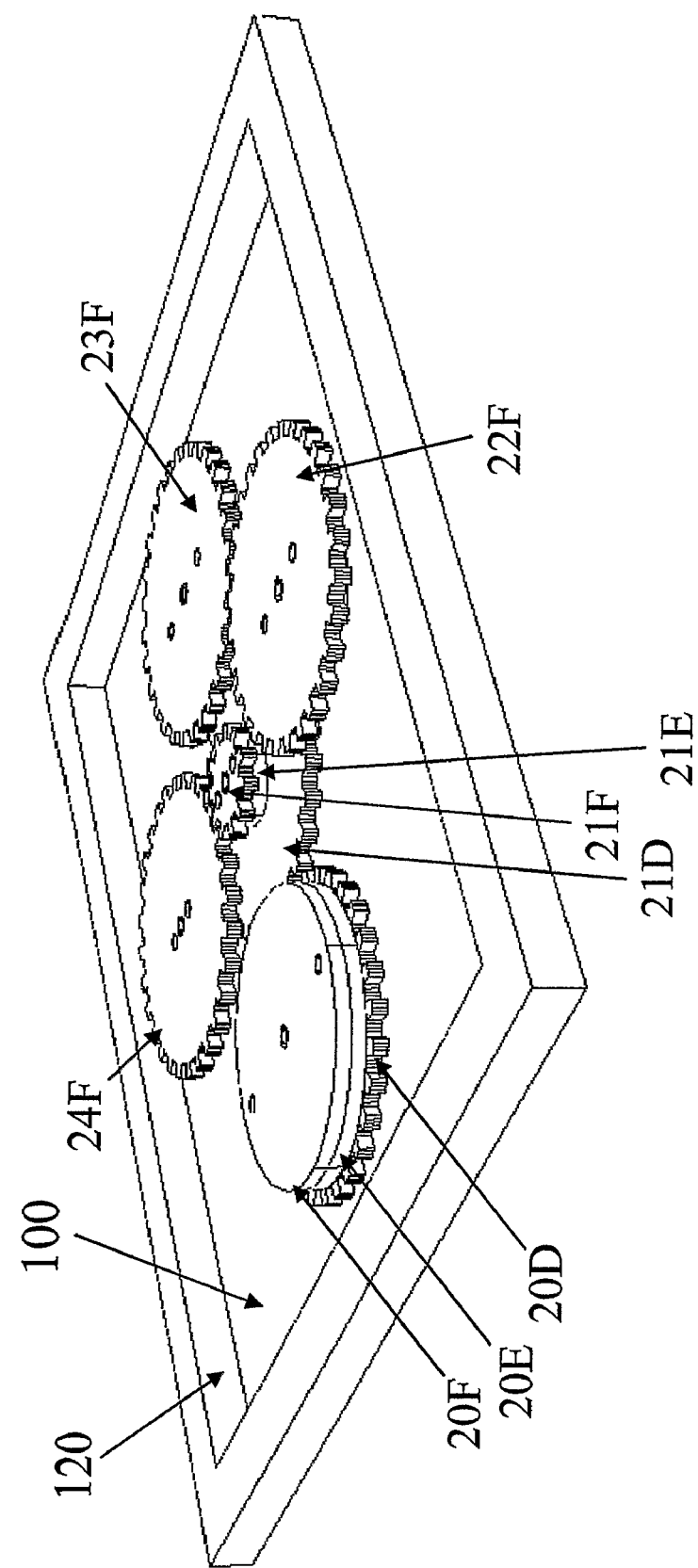
FIGS. 16 and 17 show the parts first released and then assembled, respectively, with and without the assembly area.

FIG. 16 shows the assembled parts removed from the carriers 10D, 10E, 10F remaining within the cavity 100. Further processing using parts defined in other locations may be used to connect the MEMS assembly to other assemblies, drive systems, and MEMS.

Figure 17:
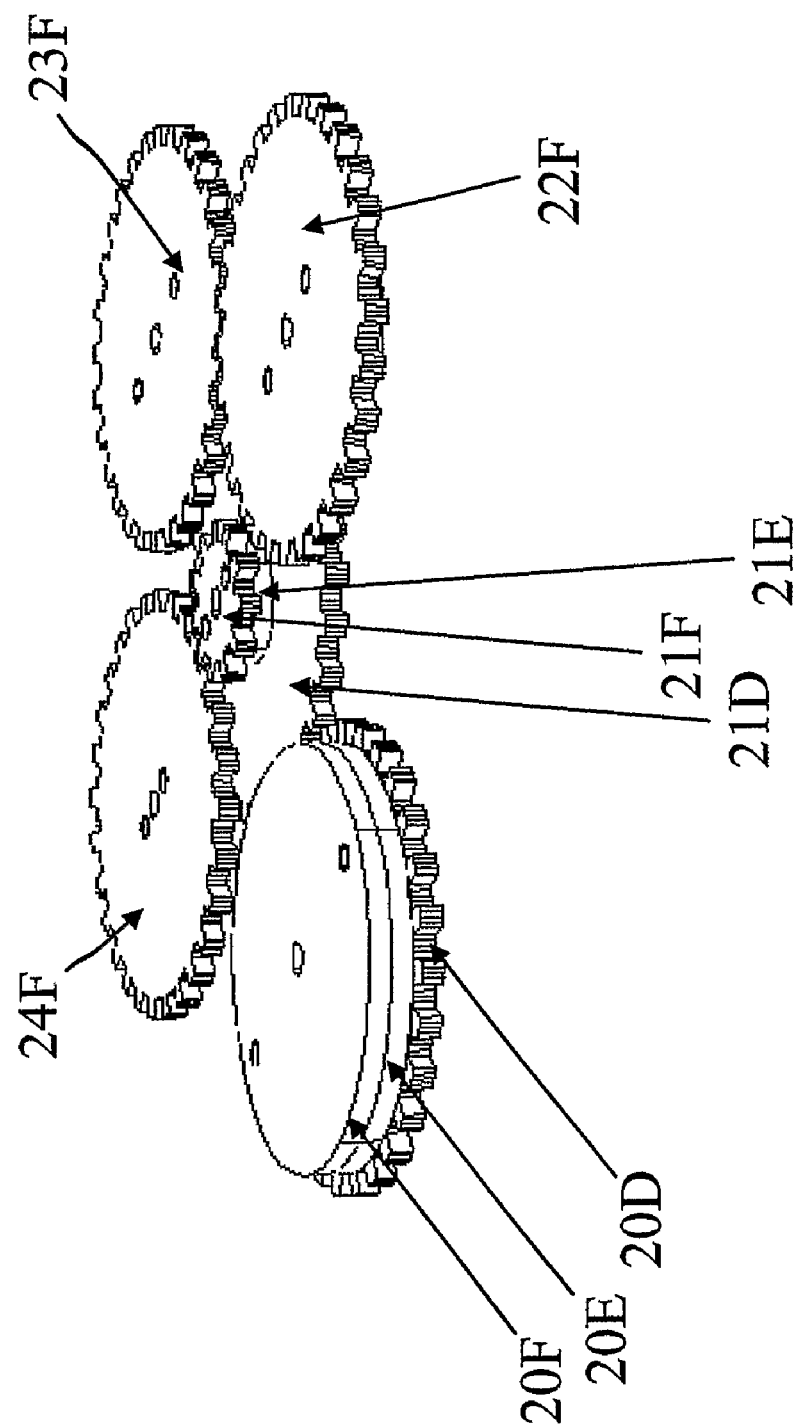

FIG. 17 shows the assembly of FIG. 16 outside cavity 100.

Since the invention provides drive or assembly mechanisms on the same substrate, assembles the various parts into one or more multi-level system, and places such assemblies into (or onto) another assembly, in order for such construction to be optimized it requires using manufacturing steps that are characteristic of a standard CMOS fabrication facility. Accordingly, an outline of the process flow using existing CMOS manufacturing steps will be described hereinafter.

1. Pattern and etch cavity and alignment structures.
   a. Si substrate
   b. Pattern with conventional photolithography
   c. Etch with conventional RIE
   d. Alignment structures and sidewalls may be sloped to aid in alignment and to avoid stiction.
2. Deposit sacrificial layer upon which carriers and parts will be processed.
   a. Sacrificial layer may be SiLK, DLC, or traditional oxides or metals. (SiLK is a semiconductor dielectric manufactured by Dow Chemical Corp). This material includes various formulations of the product, known also under the name of Porous SiLK. It is a polymer resin made of Gamma-butyrolactone, proprietary B-staged polymer and mesitylene. Another material which is preferentially used is a diamond like carbon (DLC), i.e., an amorphous carbon containing coating wherein a proportion of the carbon atoms are bonded in a manner that is similar to diamond and which resembles in many ways to diamond.
   b. Thickness is 1-10 µm to allow full release of subsequent parts
3. Deposit layers that comprise carriers, parts, and pins on parts
   a. Deposit SiN as a RIE-stop and for adhesion characteristics (500-5000 Å)
   b. Deposit $SiO_2$ as base dielectric layer
   c. Deposit SiN layer
   d. Optionally deposit $SiO_2$ layer for the pins on the parts
   e. Pattern and etch pins using conventional photolithography in $SiO_2$ and SiN layers
   f. Pattern and etch carriers and parts using conventional photolithography in base dielectric layer.
   g. Base dielectric layer may be patterned and etched for electrical structures:
      i. Pattern using conventional photolithography
      ii. Etch using conventional RIE
      iii. Deposit liner-seed using conventional PVD process
      iv. Fill using conventional Cu electro-deposition
      v. CMP using conventional process
      vi. Deposit SiN encapsulation
4. Release sacrificial layer which frees carries with parts still attached to the carrier. These materials are removed by way of oxygen plasma exposure if there is no oxadizable material that is exposed. If there is an oxidizable material that will be exposed during the removal of the organic material an $H_2/CO_2/CO/N_2$ type plasma removal could be used. Practitioners of the art will readily recognize these gas mixtures when reactive ion etching.
   a. Etch SiN to expose original release layer from 2a.
   b. Perform final release of parts using $O_2$ plasma.
5. Activate the drive mechanism for assembling purposes
   a. Individual carriers are moved to the assembly cavity using conventional transport mechanisms
   b. The carrier is placed/dropped into carrier (many possibilities), namely:
      i. Pinion gears may have shoulder that rides over rack on sides of carrier.
      ii. As carrier is driven over cavity using rack and pinion, the carrier holding the parts is held horizontal by the shoulder of the pinion gear and the substrate surface below the shoulder of the pinion.
      iii. The gears are positioned such that as the rack of the carrier is driven beyond the pinion gear and the trailing edge of the carrier will already fall within the bounds of the cavity.
      iv. The result is the positioning of the carrier in the bottom of the cavity through the alignment pins defined during the cavity etching.
      v. The carrier is offset to the assembly area such that at least one side is held up by the top surface of the substrate until in position.
6. Release parts from the carrier, leaving the assembly within the cavity
   a. Timed dry etch sufficient to remove tabs holding parts to carrier
   b. Carriers remain in cavity without obstructing final assembly.

What is claimed is:

1. An on-chip system on a substrate comprising:
   at least one carrier holding a plurality of parts integral to said at least one carrier;

an assembly area having a cavity provided with alignment posts; and a transport for moving said at least one carrier to said assembly area, and for moving a subset of said parts to said cavity onto said alignment posts, said plurality of parts being attached to said carrier by filling a gap between said carrier and said plurality of parts with material that is selectively etched with respect to the material that said carrier and said plurality of parts are made of.

2. The on-chip system as recited in claim 1, wherein said transport is provided with a plurality of comb drives engaging gears.

3. The on-chip system as recited in claim 1, wherein said plurality of parts within said cavity are in a pre-assigned order.

4. The on-chip system as recited in claim 1, wherein said alignments form sidewalls of said cavity.

5. The on-chip system as recited in claim 1, wherein said plurality of parts are detached from said carrier after being placed in said cavity.

6. The on-chip system as recited in claim 1, wherein said plurality of parts are attached to said carrier by mechanical tabs.

7. The on-chip system as recited in claim 6, wherein said mechanical tabs are removed by isotropic etch.

8. The on-chip system as recited in claim 6, wherein said mechanical tabs are removed by electrical current that causes mechanical destruction of said tabs.

9. The on-chip system as recited in claim 6, wherein said mechanical tabs are removed by laser ablation.

10. The on-chip system as recited in claim 1, wherein said carrier is removed from said assembly area after said parts have been detached.

11. The on-chip system as recited in claim 1, wherein the carrier remains in-situ after detaching said plurality of parts.

12. The on-chip system as recited in claim 1, wherein said plurality of parts and said assembly area are fabricated concurrently and assembled.

13. The on-chip system as recited in claim 1, wherein said transport is controlled by a driver.

14. The on-chip system as recited in claim 13, wherein said driver comprises comb drives coupled to gears.

15. The on-chip system as recited in claim 14, wherein said gears engage matching teeth of said carrier.

16. The on-chip system as recited in claim 15, wherein said gears are provided with a shoulder to stabilize said carrier.

17. The on-chip system as recited in claim 16, wherein said shoulders ride over said matching teeth positioned on the sides of said carrier.

* * * * *